US012696426B1

(12) United States Patent
Megarity et al.

(10) Patent No.: US 12,696,426 B1
(45) Date of Patent: Jul. 28, 2026

(54) UNITARY HEATSINK FOR MULTI-SOCKET COMPUTING SYSTEMS

(71) Applicant: Amazon Technologies, Inc., Seattle, WA (US)

(72) Inventors: William Mark Megarity, Renton, WA (US); Chetan Sanjay Agarwal, Surrey (CA); Ali Elashri, Issaquah, WA (US); Sibi Mathew, Bothell, WA (US); Virginia Dunn, Seattle, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 145 days.

(21) Appl. No.: 18/519,934

(22) Filed: Nov. 27, 2023

(51) Int. Cl.
 *H05K 7/20* (2006.01)

(52) U.S. Cl.
 CPC ..... *H05K 7/20509* (2013.01); *H05K 7/20418* (2013.01)

(58) Field of Classification Search
 None
 See application file for complete search history.

(56) References Cited

U.S. PATENT DOCUMENTS

| | | | | |
|---|---|---|---|---|
| 10,856,441 B1 * | 12/2020 | Huang | ............... | H05K 7/20727 |
| 12,309,962 B2 * | 5/2025 | Anderl | ............... | H01L 23/3672 |

| | | | | |
|---|---|---|---|---|
| 2014/0110090 A1 * | 4/2014 | Ma | ........................ | H01L 23/427 |
| | | | | 165/121 |
| 2014/0160679 A1 * | 6/2014 | Kelty | ................... | G02B 6/4269 |
| | | | | 361/700 |
| 2015/0342023 A1 * | 11/2015 | Refai-Ahmed | .... | H05K 7/20154 |
| | | | | 29/829 |
| 2021/0345519 A1 * | 11/2021 | Tian | ................... | H05K 7/20809 |
| 2023/0200013 A1 * | 6/2023 | Sano | ................... | H05K 7/20336 |
| | | | | 361/689 |

OTHER PUBLICATIONS

Kennedy, "Massive Microsoft Azure HBv4 AMD EPYC Genoa Heatsink", Available online at: https://www.servethehome.com/massive-microsoft-azure-hbv4-amd-epyc-genoa-heatsink/, Dec. 26, 2022, pp. 1-6.

* cited by examiner

*Primary Examiner* — Courtney L Smith
(74) *Attorney, Agent, or Firm* — Kilpatrick Townsend & Stockton LLP

(57) ABSTRACT

An apparatus of a computing component system can include a heatsink. A first heat transfer device may extend outward from the heatsink to facilitate receipt of heat from a first socket zone, and a second heat transfer device may extend outward from the heatsink to facilitate receipt of heat from a second socket zone. For example, the first socket zone and the second socket zone may each include a processor or other heat-generating component coupled with a plate that may in turn be coupled with the heat transfer device to enable heat transfer to the heatsink so that the heatsink dissipates heat from both socket zones.

15 Claims, 5 Drawing Sheets

UNITARY HEATSINK FOR MULTI-SOCKET COMPUTING SYSTEMS

BACKGROUND

Computing systems can be subject to many factors that may impact performance. Many relevant factors can relate to mechanical aspects of the components that are utilized in computing systems. Some mechanical considerations can relate to dissipation of heat that may be generated from one or more chips, a set of dice (which may include one die or more than one dice or dies), or other heat-generating components in use. Other considerations can include size limitations. Even minor changes to accommodate and balance among such considerations may render cost savings and/or operational performance benefits that may be significant or non-negligible, especially when implemented across large scale production volumes typical with manufacture of components for computing systems.

BRIEF DESCRIPTION OF THE DRAWINGS

Various embodiments in accordance with the present disclosure will be described with reference to the drawings, in which.

DETAILED DESCRIPTION

Embodiments herein can relate to computing component systems, such as may be provided with a unitary heatsink arranged to dissipate heat from two or more processors or other heat-generating components that may be implemented within a chassis (such as a server chassis) or other environment. Heat may be carried to the unitary heatsink from the multiple heat sources by separate heat transfer devices such as heat pipes, thermosyphons, thermal electric coolers, or other suitable structure. For example, one heat pipe device (including one or more heat pipes) may carry heat from a first processor to the unitary heatsink, while a second heat pipe device may carry heat from a second processor to the same unitary heatsink. Portions of the separate heat transfer devices may be routed into the unitary heatsink and cross each other, pass each other, and/or otherwise be arranged internally within the unitary heatsink so that at least some portion of an overall area of the unitary heatsink is capable of dissipating heat from both of the heat transfer devices.

In the following description, various embodiments will be described. For purposes of explanation, specific configurations and details are set forth to provide a thorough understanding of the embodiments. However, it will also be apparent to one skilled in the art that the embodiments may be practiced without the specific details. Furthermore, wellknown features may be omitted or simplified in order not to obscure the embodiment being described.

Figure 1:
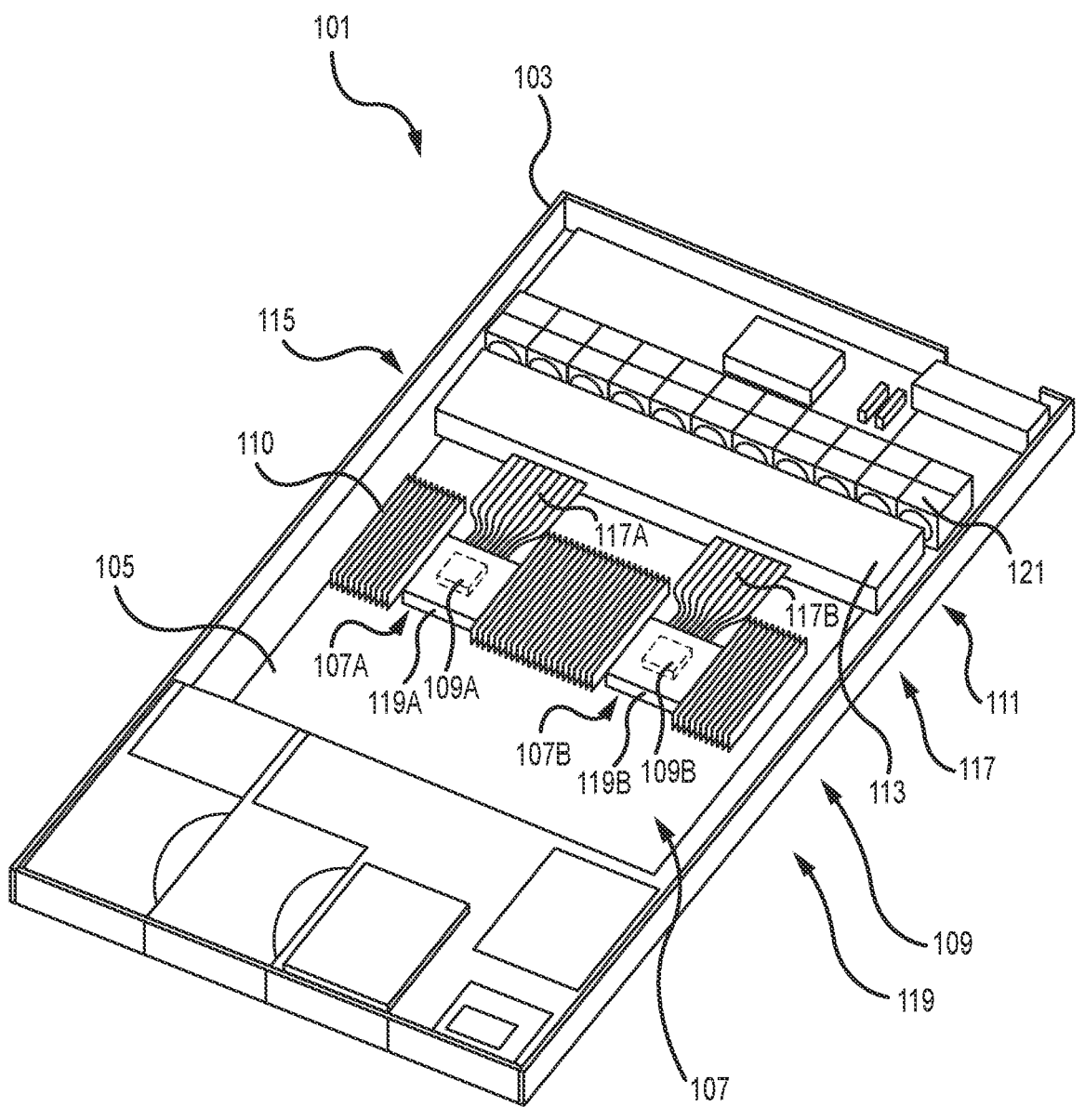
FIG. 1 illustrates a perspective view of examples of components that may be implemented within a computing system, in accordance with various embodiments.

FIG. 1 illustrates a perspective view of a system 101. The system may correspond to a computing system. For example, the system 101 may include components that may be suitable for including in servers, routers, network switches, or other computing devices.

The system 101 is shown with a chassis 103. Other components of the system 101 can be included in the chassis 103. The chassis 103 may be formed of sheet-metal or other suitable structure. In some examples, the chassis 103 may be slidable relative to a rack, such as a server rack.

The chassis 103 can include a board 105. The board 105 may correspond to a motherboard and/or other suitable board for receiving and/or interfacing with other elements of the system 101.

Multiple socket zones 107 may be defined in the system 101. FIG. 1 shows a first socket zone 107A and a second socket zone 107B, although any number of two or more socket zones 107 may be utilized. As an illustrative example, the system 101 may correspond to a two-socket server, although features of the system 101 may be implemented in three-socket, four-socket, or n-socket varieties of servers or other computing devices.

Each socket zone 107 may correspond to a discrete region in which a heat-generating component 109 may be installed in use. The heat-generating components 109 may correspond to integrated circuits (including chips or dice) or other heat-generating components. Non-limiting examples may include a processor, an input/output (I/O) chip, a baseboard management controller, a chip, a die, a card (e.g., which may include a printed circuit board that bears other components), a voltage regulator, a hotswap controller, an inductor, a resister, or a capacitor. Each heat-generating component 109 may include one or more subcomponents that generate heat. FIG. 1 shows a first heat-generating component 109A and a second heat-generating component 109B respectively in the first socket zone 107A and in the second socket zone 107B, although any number of two or more heat-generating components 109 may be utilized. In some examples, the first heat-generating component 109A may be a first processor and the second heat-generating component 109B may be a second processor, although the heat-generating components 109 may be of similar or different types of components relative to each other. A separate socket zone 107 may be present for each heat-generating component 109. The socket zones 107 may be positioned among memory cards and/or other discrete elements 110 supported by the board 105.

A heat dissipation system 111 may be included with suitable components for dissipating heat from the heat-generating components 109. A heatsink 113 may include suitable structure in a suitable position for dissipating heat from multiple socket zones 107 (e.g., from multiple heat-generating components 109). Suitable structure of the heatsink 113 may include a fin stack or other suitable heat dissipation structure. Suitable positioning of the heatsink 113 may include being positioned in a remote zone 115. The remote zone 115 may be on the board 105 or off the board 105 (e.g., supported by the chassis 103 and/or other components within the system 101). The remote zone 115 may be discontinuous from or otherwise remote from the first socket zone 107A and the second socket zone 107B, for example. The heatsink 113 may be a remote heatsink 113, for example.

Suitable structure may be included for carrying heat to the heatsink 113, e.g., from multiple socket zones 107. Heat may be carried by members, conduits, and/or other structures of heat transfer devices 117, for example. FIG. 1 shows a first heat transfer devices 117A and a second heat transfer devices 117B, although any number of two or heat transfer devices 117 may be utilized. A separate heat transfer device 117 may be present for each heat-generating component 109 and/or socket zone 107, for example.

Suitable structure may be included for transferring heat from the heat-generating components 109, such as into the heat transfer devices 117. Heat may be transferred by plates 119, for example. FIG. 1 shows a first plate 119A and a second plate 119B, although any number of two or more plates 119 may be utilized. A separate plate 119 may be present for each heat-generating component 109 and/or socket zone 107, for example. In some examples, the plate 119 may be formed of aluminum material or other material with suitable thermal conductivity properties. The plate 119 may function as a mounting plate and/or a cold plate, for example. In some examples, the plate 119 may include an upper surface that includes a finstack top for facilitating heat transfer, although in some embodiments, the plate 119 may be provided with a flat or smooth upper surface instead of a finstack top, such as to avoid interfering with airflow toward the heatsink 113 and/or to avoid additional cooling at the plate 119 that may diminish a temperature differential between the plate 119 and the heatsink 113 in a manner that may adversely affect performance of the heat transfer device 117.

The plate 119 may be arranged for receiving heat from the heat-generating component 109, e.g., to facilitate transfer out of the socket zone 107 and/or into the heat transfer device 117. The plate 119 may receive an end and/or otherwise be coupled with the heat transfer device 117, for example. In an illustrative example, heat generated by a heat-generating component 109 can be carried into an upstream portion of the heat transfer device 117 (e.g., via the plate 119) and discharged from a downstream portion of the heat transfer device 117 into the heatsink 113 for dissipation. Heat dissipation from the heatsink 113 may be accomplished or facilitated by airflow from fans 121 or other cooling elements that may be present within the chassis 103 or otherwise suitably arranged relative to the heatsink 113 and/or other components of the system 101 to provide and/or facilitate cooling.

The plate 119 is shown in FIG. 1 over the heat-generating component 109 (e.g., which may be particularly useful for capturing heat rising from an upward-facing heat-generating component 109). However, the plate 119 and heat-generating component 109 may exhibit any relative arrangement suitable for providing heat transfer therebetween. For example, positioning so that the plate 119 is supporting the heat-generating component 109 from below may be particularly useful for accommodating heat-generating component 109 having an underside bearing downward-facing dice, voltage regulators, or other components that may generate heat.

The heat transfer devices 117 may correspond to a passive heat transfer structure. Non-limiting examples may include a heat pipe, a thermosyphon, a thermal electric cooler, a vapor chamber, a solid tube of copper (or other suitable material), a fixed volume of conductive heat transfer medium, or other structure suitable for transferring heat between separated zones. In some embodiments, a given heat transfer device 117 may include multiple such components, such as multiple heat pipes, thermosyphons, or thermal electric coolers.

A heat pipe may correspond to a commercially available and/or readily manufacturable structure. The heat pipe may leverage phase transition of a contained substance to provide heat transfer between different portions of the heat pipe (e.g., typically referred to as the hot or evaporator portion and the cold or condenser portion). For example, at the hot portion, heat may be absorbed or received (e.g., from at least one of the plates 119 and/or heat-generating components 109) and may cause a liquid to convert phase to vapor that may travel along the heat pipe to reach the cold portion. At the cold portion, heat may be rejected, exhausted, and/or expelled (such as into the heatsink 113), which may cause the vapor to condense back to liquid that can travel back to the hot portion, such as through a wick or other return path delineated from a cavity or passage provided for the initial vapor travel from the hot portion to the cold portion. The heat pipe may be formed as a two dimensional vapor chamber and/or may be included individually or in a group within a vapor chamber in some examples. The heat pipe may be substantially flat (e.g., rectangular in cross-section) or otherwise suitably shaped to be formed into, fit into, and/or couple with the plate 119, the heatsink 113, and/or other elements of the system 101. An external body of the heat pipe may be formed of copper or any other suitable material.

A thermosyphon may correspond to a commercially available and/or readily manufacturable structure. The thermosyphon may leverage density variation in response to temperature differences to circulate fluid in a loop absent and/or without a mechanical pump. For example, heat may be absorbed or received (e.g., from at least one of the plates 119 and/or heat-generating components 109) at a so-called warm portion of the loop and result in thermal expansion that will decrease density and increase buoyancy of the fluid there, e.g., which may impart an upward motion in the warm portion of the loop. Heat may be rejected, exhausted, and/or expelled at a so-called cold portion of the loop, (such as into the heatsink 113), which may result in thermal contraction that will increase density and decrease buoyancy of the fluid there, e.g., which may impart a downward motion in the cold portion of the loop. The upward motion in the warm portion and the downward motion in the cold portion can provide a cyclical flow to circulate the fluid through the loop for transferring heat between the cold and warm portions.

A thermal electric cooler may correspond to a commercially available and/or readily manufacturable structure. The thermal electric cooler may leverage the Peltier effect to transfer heat from one side of the device to an opposite side of the device in response to consumption of electrical energy. For example, current may be applied to cause heat to be absorbed or received at one side (e.g., from at least one of the plates 119 and/or heat-generating components 109) and rejected, exhausted, and/or expelled at an opposite side, (such as into the heatsink 113).

Figure 2:
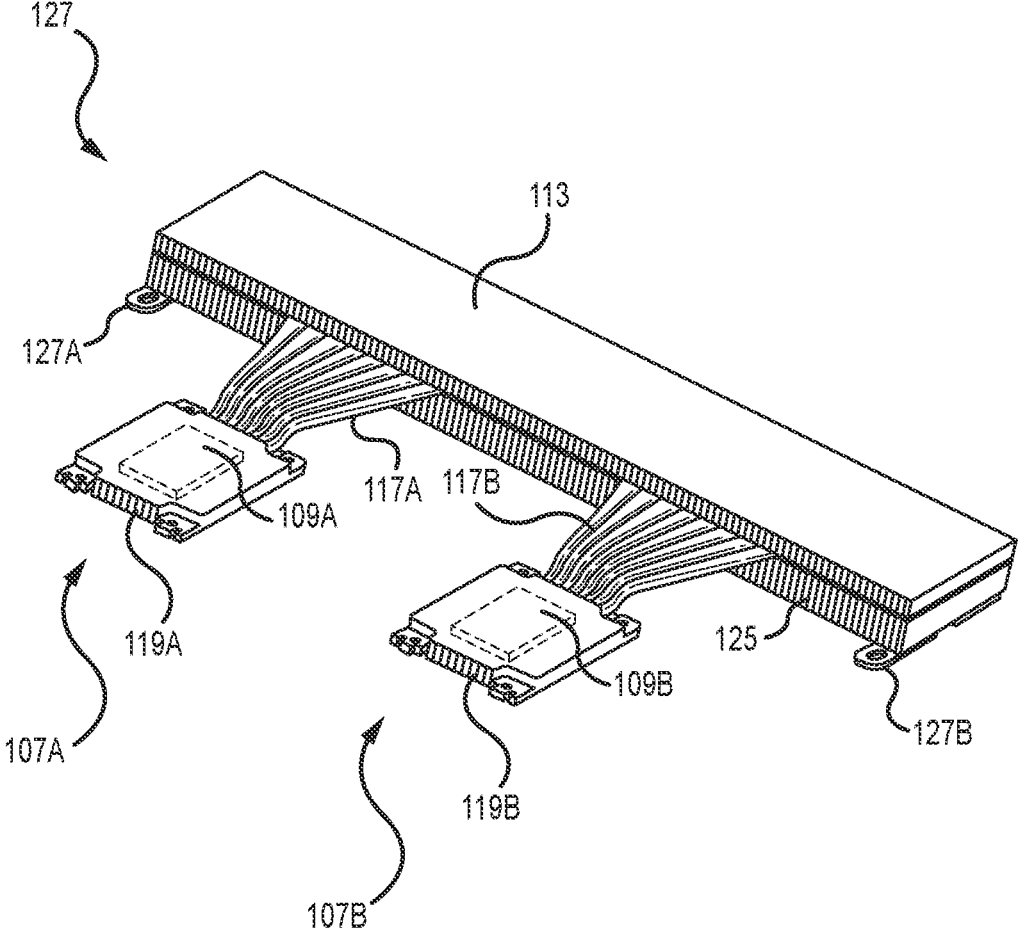
FIG. 2 shows an example of a heatsink and associated components that may be implemented in the system of FIG. 1, in accordance with various embodiments.

FIG. 2 shows an example of a heatsink 113 and associated components that may be implemented in the system 101 of FIG. 1. Some or all components in FIG. 2 may be provided individually or within assemblies or pre-constructed apparatuses that may be installed relative to the chassis 103 and/or other components of FIG. 1, for example.

As may be appreciated from FIG. 2, the heatsink 113 may be coupled with and/or accompanied by other features. The first heat transfer device 117A may be arranged extending outward from the heatsink 113 (e.g., to facilitate receipt of heat from the first socket zone 107A). The second heat transfer device 117B may be arranged extending outward from the heatsink 113 (e.g., to facilitate receipt of heat from a second socket zone 107B).

The first plate 119A may be sized and arranged for installation in the first socket zone 107A (e.g., which may be on the board 105, as discussed above with respect to FIG. 1). The first plate 119A may be coupled with the first heat transfer device 117A. For example, at least a portion of the first heat transfer device 117A may be received within or otherwise in contact with the first plate 119A. The first heat transfer device 117A may be arranged for transferring heat away from the first socket zone 107A (e.g., away from the first plate 119A and/or the first heat-generating component 109A).

The second plate 119B may be sized and arranged for installation in the second socket zone 107B (e.g., which may be on the board 105, as discussed above with respect to FIG. 1). The second plate 119B may be coupled with the second heat transfer device 117B. For example, at least a portion of the second heat transfer device 117B may be received within or otherwise in contact with the second plate 119B. The second heat transfer device 117B may be arranged for transferring heat away from the second socket zone 107B (e.g., away from the second plate 119B and/or the second heat-generating component 109B).

In operation, the heatsink 113 may be arranged to receive and dissipate heat from the first heat transfer device 117A and the second heat transfer device 117B. As may be best appreciated with respect to FIG. 1, the heatsink 113 may be configured for installation in the remote zone 115 (e.g., FIG. 1) of the board 105. The remote zone 115 can be remote from the first socket zone 107A and the second socket zone 107B.

In FIG. 2, the first socket zone 107A and the second socket zone 107B are each spaced from a selected side 125 of the heatsink 113. In some examples, the selected side 125 may correspond to a front side that faces a front of the chassis 103 (FIG. 1). However, the selected side 125 may correspond to a front side, rear side, left side, right side, or any other predetermined side of the heatsink 113. Any suitable spacing or combination of spacing from the selected side 125 may be utilized. For example, FIG. 2 depicts the first plate 119A and the second plate 119B both arranged spaced an equal distance from the selected side 125 of the heatsink 113, although the first socket zone 107A and/or the first plate 119A may be spaced a different distance from the selected side 125 when compared to spacing for the second socket zone 107B and/or the second plate 119B. Moreover, although FIG. 2 depicts that the first heat transfer device 117A and the second heat transfer device 117B each extend from the selected side 125 of the heatsink 113, arrangements are not so limited and may include other suitable arrangements, which may include some discussed further with respect to FIGS. 4 and 5.

Using a single heatsink 113 to dissipate heat from multiple socket zones 107 may provide various benefits. Utilizing a single heatsink 113 to serve multiple socket zones 107 may reduce a complexity of inventory and/or installation to manage when compared to arrangements that may instead include two side-by-side heat dissipation structures. For example, in addition to reducing an overall number of parts (e.g., by using one structure instead of two for each pair of heat-generating components 109), using a single form of heatsink 113 may be significantly simpler than managing inventory or installation if a duo of heat dissipation structures differ from one another in order to nest or otherwise accommodate differences in associated structures (such as if a left-specific heat dissipation structure is to be maintained in inventory and installed relative to a leftward part while a different right-specific heat dissipation structure is to be maintained in inventory and installed relative to a rightward part). Using a single heatsink 113 to dissipate heat from multiple socket zones 107 may facilitate faster assembly and/or lower costs than arrangements that involve installing multiple heat dissipation structures. In some examples, using a single heatsink 113 to dissipate heat from multiple socket zones 107 may enable relatively higher power devices to be implemented and still accommodated with air cooling instead of resorting to liquid cooling structures that may be more complex and/or costly. In some examples, using a single heatsink 113 to dissipate heat from multiple socket zones 107 may enable improvement to effectiveness and/or efficiency of heat transfer. Such improvements to effectiveness and/or efficiency of heat transfer may allow components to fit within a predetermined operating envelope rather than resorting to larger U heights or pitch, etc. to accommodate additional components for otherwise implementing strategies for improvements to effectiveness and/or efficiency of heat transfer.

In FIG. 2, the heatsink 113 is further shown with mounting interfaces 127. FIG. 2 shows a first mounting interface 127A and a second mounting interface 127B, although any number of two or more mounting interfaces 127 may be utilized. Each mounting interface may include a flange and/or a through-hole that may accommodate a fastener for mounting and/or installing the heatsink 113, for example. The mounting interfaces 127 may be provided at corners and/or edges of the heatsink 113. Such placement may facilitate ease of access for inserting and/or manipulating fasteners for installation, for example. Such placement additionally or alternatively may avoid encroaching into a usable area of the heatsink 113 that may be available for heat dissipation. More generally, using a single heatsink 113 may enable larger area utilization within a predetermined footprint than arrangements with multiple heat-dissipating structures that may sacrifice some useable area for accommodating more anchoring interfaces (e.g., based on having more corners or edges to anchor on account of having more total discrete parts to install).

Figure 3:
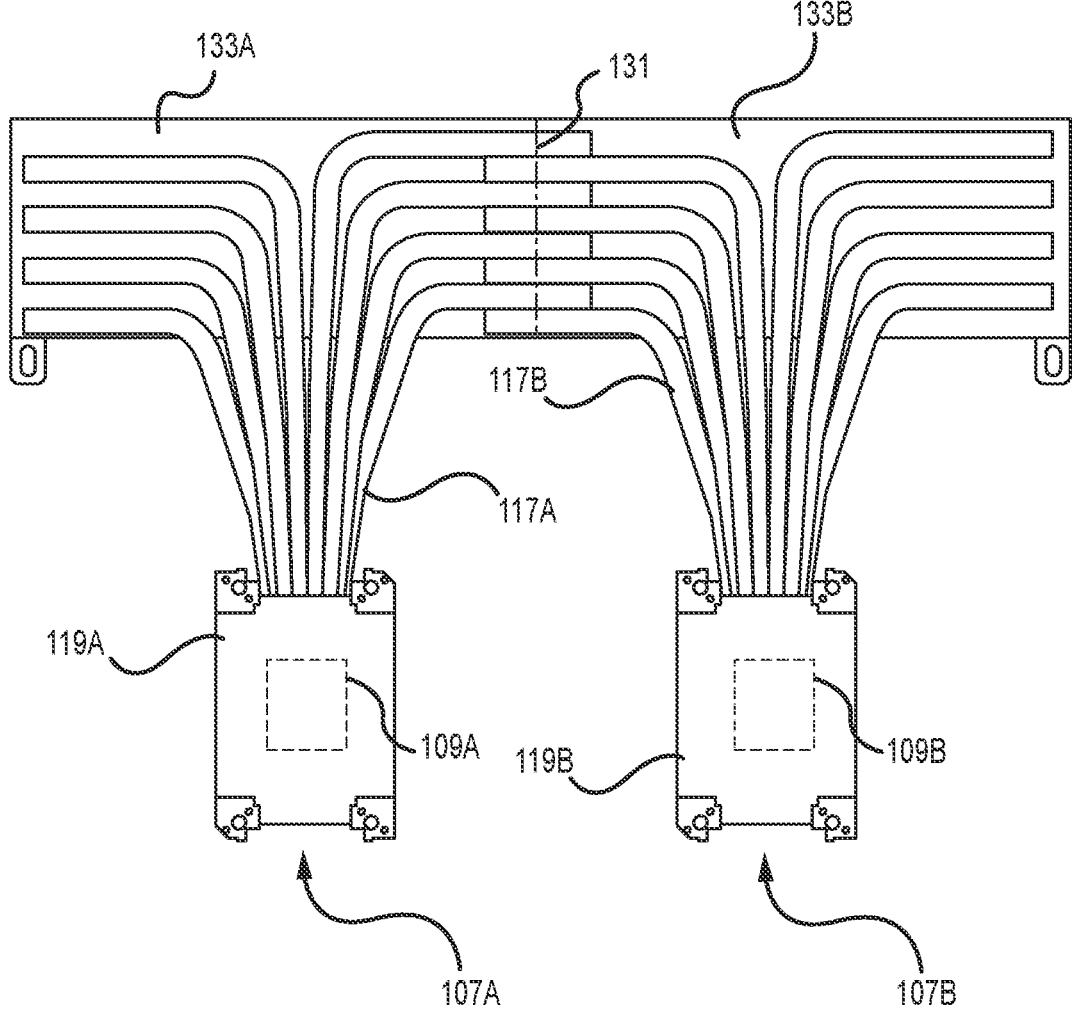
FIG. 3 is a top-down cutaway view of an internal portion of the heatsink and associated structure of FIG. 2, in accordance with various embodiments.

FIG. 3 is a top-down cutaway view of an internal portion of the heatsink 113 and associated structure of FIG. 2. The heatsink 113 may be subdivided (e.g., along a boundary line 131) into a first region 133A and a second region 133B distinct from one another. For example, the boundary line 131 may separate the first region 133A from the second region 133B. One or more elements of each of the first heat transfer device 117A and the second heat transfer device 117B may be arranged to permit each to utilize at least some area in both the first region 133A and the second region 133B for heat dissipation. For example, while the first heat transfer device 117A may extend outward from the first region 133A, the first heat transfer device 117A may also extend internally through the first region 133A and into the second region 133B. Similarly, while the second heat transfer device 117B may extend outward from the second region 133B, the second heat transfer device 117B may also extend internally through the second region 133B and into the first region 133A. Elements of the first heat transfer device 117A and the second heat transfer device 117B may interweave, overlap, cross over, and/or pass by each other and/or may otherwise be arranged relative to one another to facilitate enabling accessing area from both the first region 133A and the second region 133B. Additionally or alternatively, arrangement of elements of the first heat transfer device 117A and the second heat transfer device 117B within the heat sink 113 may permit a middle plane of the heat sink 113 to conduct heat for dissipation.

Permitting heat transfer devices 117 to reach multiple areas for heat dissipation within the heatsink 113 can provide various benefits. As one example, each heat transfer device 117 may accordingly be able to access a larger total area for heat dissipation than if separated heat dissipation structures were implemented in the same space (e.g., over one half of the space versus at most one half of the space). In addition, access to multiple areas may allow usage of capacity that may otherwise go under-utilized. For example, if the first heat transfer device 117A and the second heat transfer device 117B are experiencing different heat loads (such as if the first heat transfer device 117A is experiencing a 50 watt or other relatively low load due to a chip at the first plate 119A being in an idle or low power mode while the second heat transfer device 117B is experiencing a 300 watt or other relatively high load due to a chip at the second plate 119B being in a startup, high performance, or other high power mode), then the heat transfer device 117 experiencing the higher heat load may effectively use a larger amount of the available surface area of the heatsink 113 for dissipating the higher load while a smaller area is still being used for dissipating the lower load. In various examples, the arrangement of the heat transfer devices 117 with the heatsink 113 may allow maintaining uniform temperature of processors or other heat-generating component 109 under varying power and inlet ambient conditions. For example, such normalization may be achieved as a result of the heatsink 113 having an adaptive thermal network, e.g., due to varying heat transfer surface area accessibility.

Figure 4:
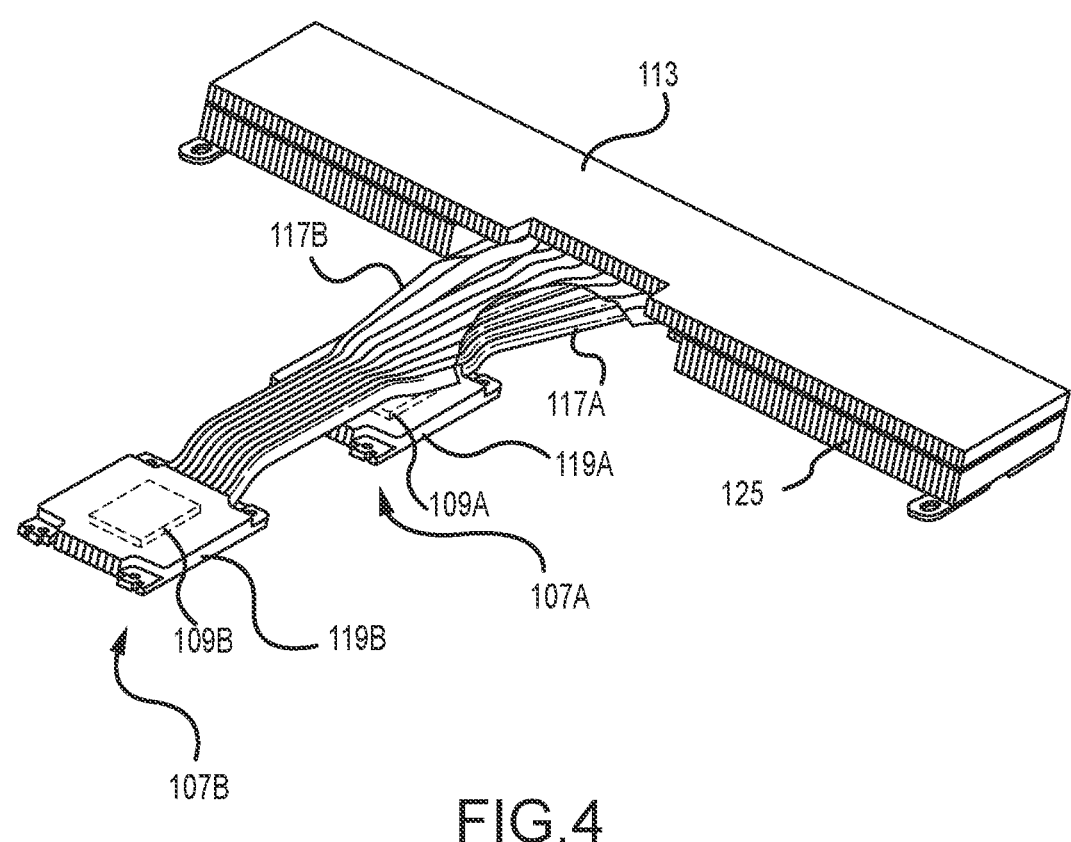
FIG. 4 shows an example of a vertically overlapping arrangement that may be implemented in the system of FIG. 1, in accordance with various embodiments.
Figure 5:
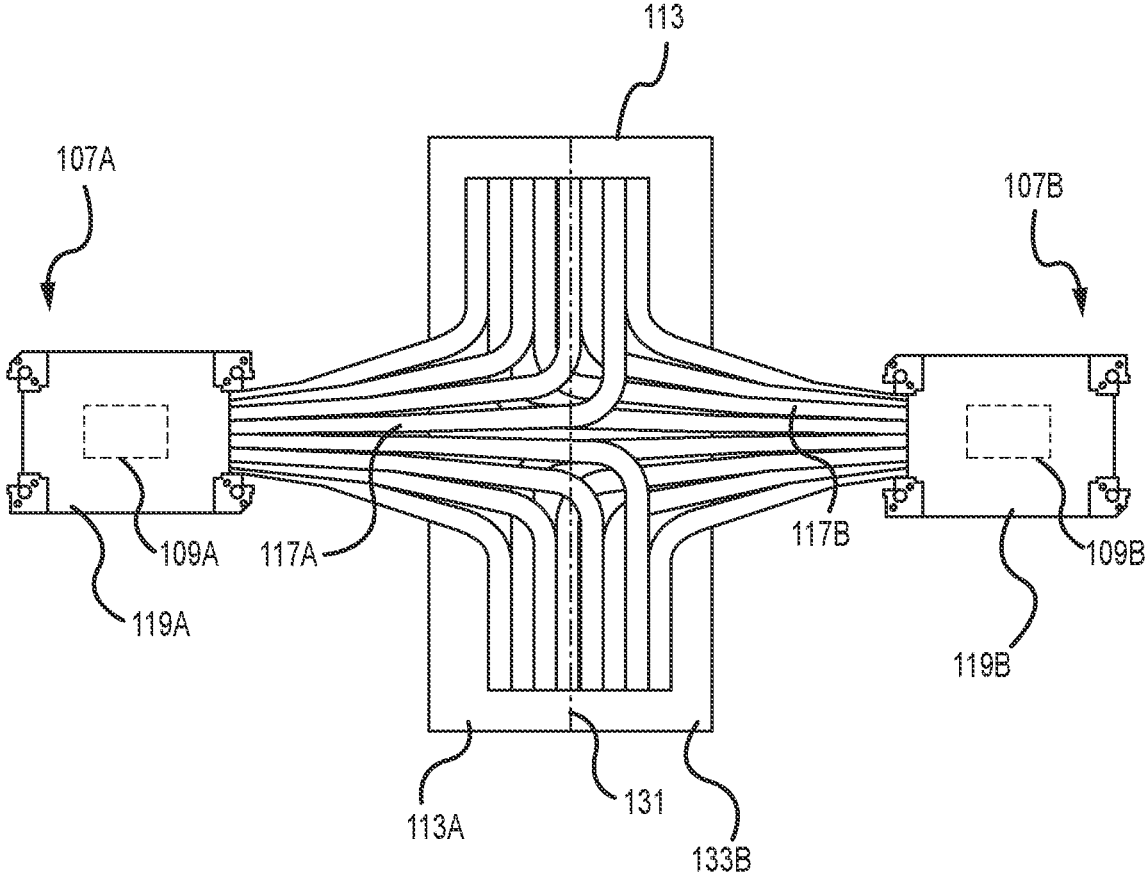
FIG. 5 shows an example of a multi-side arrangement that may be implemented in the system of FIG. 1, in accordance with various embodiments.

The heatsink 113 may be a monolithic or unitary heatsink, e.g., in the sense that as a single unit it may serve multiple sources, which may be the case even if the unit itself has individual fins or other structures that are initially formed as separate parts that are later coupled together rather than being formed as a single contiguous part. For example, to accommodate the internal layout shown in FIG. 3, the heatsink 113 may include multiple layers, e.g., such as shown in FIG. 2 on top and bottom of portions of the first heat transfer device 117A and the second heat transfer device 117B. However, the heatsink 113 is not limited to the arrangement in FIGS. 2 and 3 and may include any internal routing, including, but not limited to, upward, downward, lateral, or other crossing or non-crossing routing. Some other examples of further possible suitable arrangements relative to the heatsink 113 are also shown in FIGS. 4 and 5. Moreover, the heatsink 113 is not structures shown in FIGS. 2 and 3. For example, although an upper layer is depicted in FIG. 2 as a finstack that may extend over portions of each of the first heat transfer device 117A and the second heat transfer device 117B, the heatsink 113 additionally or alternatively may include a vapor chamber, heat pipe, thermosyphon, thermal electric cooler, finstack, or other suitable heat dissipating structure that may be in contact with and/or may receive, transfer, and/or dissipate heat from each of the first heat transfer device 117A and the second heat transfer device 117B.

FIG. 4 shows an example of a vertically overlapping arrangement that may be implemented with and/or relative to features previously described for the system 101, such as the first socket zone 107A, the second socket zone 107B, the heatsink 113, the first heat transfer device 117A, the second heat transfer device 117B, the first plate 119A, the second plate 119B, and the selected side 125 of the heatsink 113. As may be seen by way of example in FIG. 4, the first socket zone 107A and/or the first plate 119A can be spaced apart from the selected side 125 of the heatsink 113 by a different distance than the second socket zone 107B and/or the second plate 119B. For example, the first socket zone 107A may arranged between the heatsink 113 and the second socket zone 107B. Similarly, the first plate 119A may be arranged between the heatsink 113 and the second plate 119B. The second heat transfer device 117B may be arranged extending at least partially above and/or at least partially vertically overlapping the first heat transfer device 117A. A portion of the second heat transfer device 117B is shown partially cut away from view in FIG. 4 for ease of viewing the first heat transfer device 117A therebelow. For example, the first heat transfer device 117A and the second heat transfer device 117B may each extend from the selected side 125 of the heatsink 113, e.g., with the first heat transfer device 117A routed along a lower path (e.g., to reach the first plate 119A and/or the first heat-generating component 109A (FIG. 1) and with the second heat transfer device 117B routed along an upper path that at least partially overlaps and/or at least partially travels overhead of the lower path (e.g., to reach the second plate 119B and/or the second heat-generating component 109B (FIG. 1)).

FIG. 5 shows an example of a multi-side arrangement that may be implemented with and/or relative to features previously described for the system 101, such as the first socket zone 107A, the second socket zone 107B, the heatsink 113, the first heat transfer device 117A, the second heat transfer device 117B, the first plate 119A, and the second plate 119B. Components may be positioned on multiple sides (e.g., opposite sides) of the heatsink 113. The heatsink 113 may be arranged between the first socket zone 107A and the second socket zone 107B, for example. Similarly, the heatsink may be positioned between the first plate 119A and the second plate 119B.

The first heat transfer device 117A and the second heat transfer device 117B may each extend from different (e.g., opposite) sides of the heatsink 113. The heatsink 113 may be subdivided (e.g., along a boundary line 131) into a first region 133A and a second region 133B distinct from one another. For example, the boundary line 131 may separate the first region 133A from the second region 133B. One or more elements of each of the first heat transfer device 117A and the second heat transfer device 117B may be arranged to permit each to utilize at least some area in both the first region 133A from the second region 133B for heat dissipation. For example, while the first heat transfer device 117A may extend outward from the first region 133A, the first heat transfer device 117A may also extend internally through the first region 133A and into the second region 133B. Similarly, while the second heat transfer device 117B may extend outward from the second region 133B, the second heat transfer device 117B may also extend internally through the second region 133B and into the first region 133A. At least some internal portions of the first heat transfer device 117A and the second heat transfer device 117B may interweave, overlap, cross over, and/or pass by each other and/or may otherwise be arranged relative to one another to facilitate enabling accessing area from both the first region 133A and the second region 133B.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An apparatus, comprising:
a first plate sized and arranged for installation in a first socket zone of a circuit board;
a first heat transfer device arranged for transferring heat away from the first socket zone;
a second plate sized and arranged for installation in a second socket zone of the circuit board;
a second heat transfer device arranged for transferring heat away from the second socket zone; and
a heatsink arranged to receive and dissipate heat from the first heat transfer device and the second heat transfer device and configured for installation in a remote zone remote from the first socket zone and the second socket zone, wherein the heatsink is subdivided into a first region and a second region distinct from one another, wherein the first heat transfer device extends outward from the first region and also extends internally through the first region into the second region, and wherein the second heat transfer device extends outward from the second region and also extends internally through the second region into the first region.

2. The apparatus of claim 1, wherein the first plate and the second plate are both arranged spaced from a same side of the heatsink.

3. The apparatus of claim 1, wherein the first plate is arranged between the heatsink and the second plate.

4. The apparatus of claim 1, wherein the heatsink is positioned between the first plate and the second plate.

5. The apparatus of claim 1, wherein the first socket zone is configured for receiving a first heat-generating component; and
wherein the second socket zone is configured for receiving a second heat-generating component.

6. The apparatus of claim 5, further comprising the first heat-generating component and the second heat-generating component.

7. The apparatus of claim 6, wherein at least one of the first heat-generating component or the second heat-generating component comprises a processor, an input/output chip, a baseboard management controller, a chip, a die, a card, a voltage regulator, a hotswap controller, an inductor, a resister, or a capacitor.

8. The apparatus of claim 6, wherein the first heat-generating component comprises a first processor and the second heat-generating component comprises a second processor;
wherein the apparatus is included in a computing component system that further comprises a chassis and the circuit board, the circuit board mounted in the chassis and defining the first socket zone and the second socket zone;
wherein the first heat transfer device comprises a first heat pipe set extending from the first plate and arranged for transferring heat away from the first socket zone; and
wherein the second heat transfer device comprises a second heat pipe set extending from the second plate and arranged for transferring heat away from the second socket zone.

9. An apparatus, comprising:
a heatsink;
a first heat transfer device extending outward from the heatsink to facilitate receipt of heat from a first socket zone on a circuit board; and
a second heat transfer device extending outward from the heatsink to facilitate receipt of heat from a second socket zone on the circuit board,
wherein the heatsink is subdivided into a first region and a second region distinct from one another, wherein the first heat transfer device extends outward from the first region and also extends internally through the first region into the second region, and wherein the second heat transfer device extends outward from the second region and also extends internally through the second region into the first region.

10. The apparatus of claim 9, wherein the first heat transfer device comprises a heat pipe, a thermosyphon, or a thermal electric cooler.

11. The apparatus of claim 9, wherein the first heat transfer device and the second heat transfer device each extend from a same side of the heatsink.

12. The apparatus of claim 9, wherein the second heat transfer device is arranged extending at least partially above the first heat transfer device.

13. The apparatus of claim 9, wherein the first heat transfer device and the second heat transfer device each extend from opposite sides of the heatsink.

14. The apparatus of claim 9, further comprising:

the circuit board;

a first plate arranged for installation in the first socket zone of the circuit board and coupled with the first heat transfer device to facilitate transfer of heat away from the first socket zone via the first heat transfer device; and a second plate arranged for installation in the second socket zone of the circuit board and coupled with the second heat transfer device to facilitate transfer of heat away from the second socket zone via the second heat transfer device, wherein the heatsink is arranged to receive and dissipate heat from the first heat transfer device and the second heat transfer device and is configured for installation in a remote zone of the circuit board remote from the first socket zone and the second socket zone.

15. The apparatus of claim 14, wherein the first socket zone is configured for receiving a first heat-generating component;

wherein the second socket zone is configured for receiving a second heat-generating component;

wherein the first heat-generating component comprises a first processor and the second heat-generating component comprises a second processor;

wherein the apparatus is included in a computing component system that further comprises a chassis and the circuit board, the circuit board mounted in the chassis and defining the first socket zone and the second socket zone;

wherein the first heat transfer device comprises a first heat pipe set extending from the first plate and arranged for transferring heat away from the first socket zone; and wherein the second heat transfer device comprises a second heat pipe set extending from the second plate and arranged for transferring heat away from the second socket zone.

* * * * *